(12) United States Patent
Gomm et al.

(10) Patent No.: US 9,479,151 B2
(45) Date of Patent: Oct. 25, 2016

(54) APPARATUSES AND METHODS FOR CONTROLLING DELAY CIRCUITS DURING AN IDLE STATE TO REDUCE DEGRADATION OF AN ELECTRICAL CHARACTERISTIC

(71) Applicant: Micron Technology, Inc., Boise, ID (US)

(72) Inventors: Tyler J. Gomm, Boise, ID (US); Scott D. Van De Graaff, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 4 days.

(21) Appl. No.: 14/046,786

(22) Filed: Oct. 4, 2013

(65) Prior Publication Data

US 2015/0097609 A1    Apr. 9, 2015

(51) Int. Cl.
*H03K 5/14* (2014.01)
*H03K 5/00* (2006.01)

(52) U.S. Cl.
CPC ....... *H03K 5/14* (2013.01); *H03K 2005/00215* (2013.01)

(58) Field of Classification Search
CPC ......... H03L 7/06; H03L 7/08; H03L 7/0802; H03L 7/0812; H03L 7/0814; G11C 7/22; G11C 7/222; H03K 5/14; H03K 5/133; H03K 5/135
USPC ................................ 327/147, 156, 158, 161
See application file for complete search history.

(56) References Cited

U.S. PATENT DOCUMENTS

| | | | |
|---|---|---|---|
| 5,909,133 A | 6/1999 | Park | |
| 5,963,069 A | 10/1999 | Jefferson et al. | |
| 6,137,334 A | 10/2000 | Miller, Jr. et al. | |
| 6,346,837 B1 | 2/2002 | Shibayama | |
| 6,445,231 B1 | 9/2002 | Baker et al. | |
| 6,483,359 B2 | 11/2002 | Lee | |
| 6,489,823 B2 * | 12/2002 | Iwamoto | 327/158 |
| 6,549,041 B2 | 4/2003 | Waldrop | |
| 6,586,979 B2 | 7/2003 | Gomm et al. | |
| 6,728,163 B2 | 4/2004 | Gomm et al. | |
| 6,737,897 B2 | 5/2004 | Gomm et al. | |
| 6,759,883 B2 | 7/2004 | Gomm | |
| 6,930,525 B2 | 8/2005 | Lin et al. | |
| 7,583,115 B2 | 9/2009 | Gomm et al. | |
| 8,237,474 B2 | 8/2012 | Gomm et al. | |
| 2002/0135409 A1 | 9/2002 | Gomm et al. | |
| 2002/0190767 A1 | 12/2002 | Gomm et al. | |
| 2003/0215040 A1 * | 11/2003 | Bell | G11C 7/22 375/376 |
| 2006/0044029 A1 * | 3/2006 | Gomm et al. | 327/153 |
| 2009/0309637 A1 | 12/2009 | Gomm et al. | |
| 2010/0156486 A1 * | 6/2010 | Yun et al. | 327/158 |
| 2012/0293211 A1 | 11/2012 | Gomm et al. | |

* cited by examiner

*Primary Examiner* — John Poos
(74) *Attorney, Agent, or Firm* — Dorsey & Whitney LLP

(57) ABSTRACT

Delay circuits may be controlled by apparatuses and methods during an idle state to reduce degradation of an electrical characteristic. An example apparatus includes a delay line circuit including a plurality of delay stages, and further includes a delay line control circuit coupled to the delay line circuit. The delay line control circuit is configured to enable delay stages of the plurality of delay stages, and is further configured to control enabled delay stages of the plurality of delay stages to provide a respective output clock signal having a high logic level during an idle state.

21 Claims, 5 Drawing Sheets

APPARATUSES AND METHODS FOR CONTROLLING DELAY CIRCUITS DURING AN IDLE STATE TO REDUCE DEGRADATION OF AN ELECTRICAL CHARACTERISTIC

BACKGROUND

Integrated circuit memories use various clock signals to control the timing of internal operations. The clock signals may be generated by clock circuits included in the memories, which may include delay line circuits to adjust the timing of the clock signals relative to one another. In generating a clock signal, an input clock signal may be delayed through a delay line circuit to provide an output clock signal having a delay relative to the input clock signal. The delay line circuit ideally provides an output signal that is a true version of the input signal, but delayed. However, due to imbalances in electrical characteristics of circuits included in the delay line circuit, the input clock signal may be distorted as it propagates through the delay line circuit to provide the output clock signal. For example, a delay line circuit including circuits having imbalanced electrical characteristics may introduce duty cycle error when providing an output clock signal.

Electrical characteristics of circuits may become imbalanced due to operating conditions to which the circuits are subject during normal operation. For example, particular ones of the circuits included in a delay line circuit may be subjected to operating conditions (e.g., voltage and/or current conditions) that cause degradation of the electrical characteristics for those particular circuits. Other similar circuits also included in the delay line circuit, however, may not be subjected to the same operating condition and consequently do not degrade to the same extent. Thus, the circuits of the delay line circuit, which in theory should operate similarly, degrade unevenly. The resulting performance of the circuits subjected to the operating condition may be different than the performance of the circuits not subjected to the operating condition. The difference in performance of the circuits may cause the circuits to distort an input signal clock as it propagates through the delay line circuit to provide an output clock signal. As known, a distorted output clock signal may significantly limit circuit performance.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
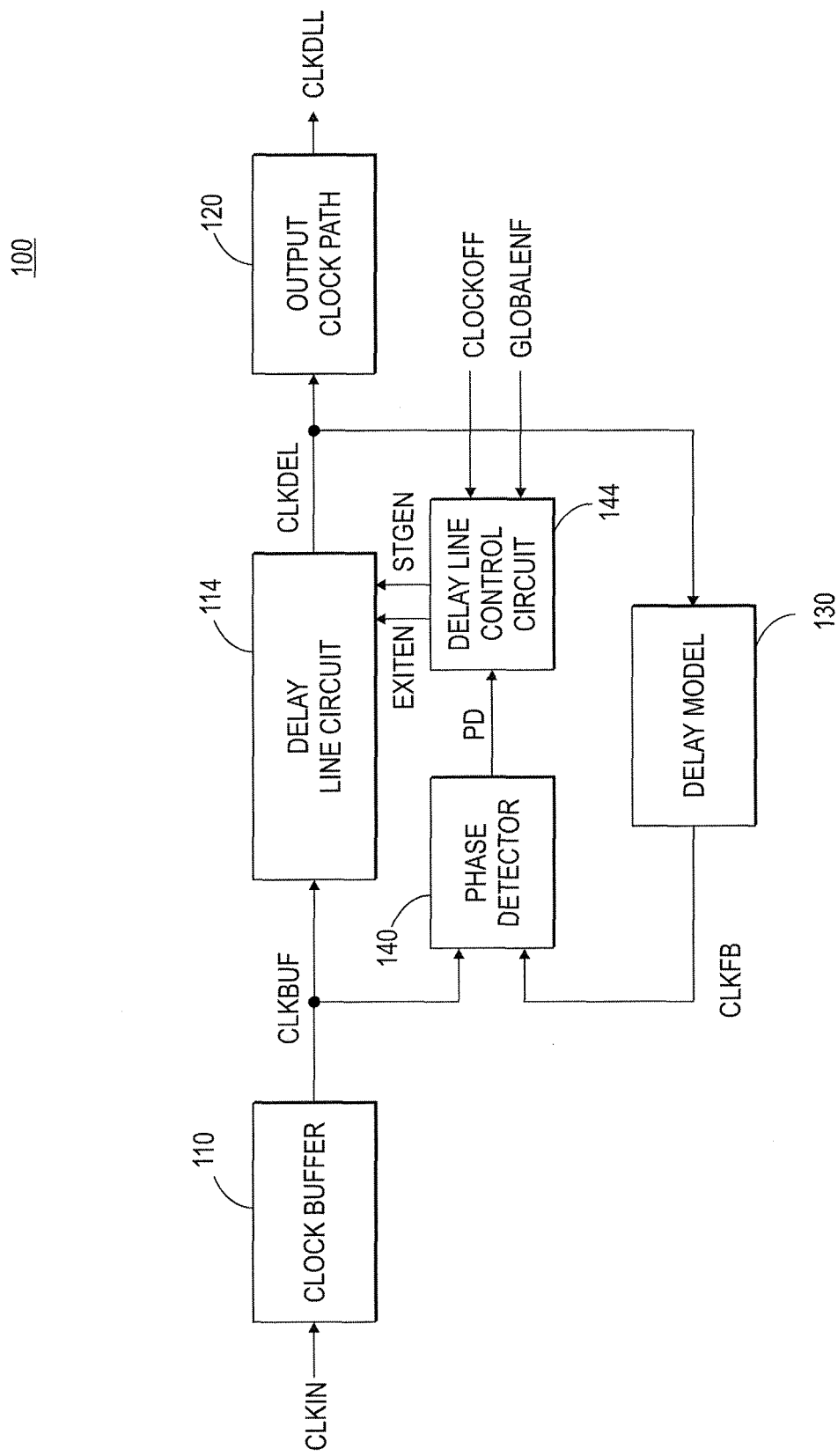
FIG. 1 is a block diagram of an apparatus that includes a delay line control circuit according to an embodiment of the invention.

FIG. 1 illustrates an apparatus including a clock circuit 100 including a delay line control circuit 144 according to an embodiment of the invention. An apparatus may refer to, for example, an integrated circuit, a memory device, a memory system, an electronic device or system, a smart phone, a tablet, a computer, a server, etc. The circuit 100 is configured to provide an output clock signal CLKDLL that is in phase with an input clock signal CLKIN. The circuit 100 includes a clock buffer 110 configured to be provided the CLKIN signal and provide a buffered clock signal CLKBUF to a delay line circuit 114. The CLKBUF signal has a delay relative to the CLKIN signal due to the inherent propagation delay of the circuitry of the clock buffer 110. The delay line circuit 114 provides a delay to the CLKBUF signal to provide a delayed clock signal CLKDEL. The delay line circuit 114 may include delay stages (not shown in FIG. 1) that when enabled add delay to the CLKBUF signal as it propagates through the delay stages to provide the CLKDEL signal. The delay of the delay line circuit 114 may be based at least in part on delay stage enable signals STGEN and the output of the CLKDEL signal may be based at least in part on stage exit enable signals EXITEN, as will be described in more detail below. The CLKDEL signal is output as the CLKDLL signal by a provided clock path 120. The clock path 120 may include several circuits and signal lines, for example, a clock tree configured to distribute the CLKDEL signal from the delay line circuit 114 over signal lines to clock buffers, which in turn provide the CLKDEL signal to different circuits that may be clocked by the CLKDLL signal, such as clocked data buffers. The circuits and signal lines have inherent propagation delay that add delay to the CLKDEL signal.

The CLKDEL signal is also provided to a feedback clock path having a delay model 130. The delay model 130 models the propagation delay of the clock buffer 110 and the output clock path 120, and provides a feedback clock signal CLKFB having a model delay relative to the CLKDEL signal. The CLKFB signal is provided to a phase detector 140. The phase detector 140 is configured to detect a phase difference between the CLKBUF and CLKFB signals and provide a phase difference signal PD that is indicative of the phase difference between the CLKBUF and CLKFB signals. The PD signal provided by the phase detector 140 is used by the delay line control circuit 144 to provide the STGEN and EXITEN signals to adjust the delay of the delay line circuit 114. As a result, the delay of the delay line circuit 114 is adjusted based at least in part on the phase difference of the CLKBUF and CLKFB signals. The delay line control circuit 144 may be further provided a global enable signal GLOBALENF and a delay stage hold signal CLOCKOFF which may be used to control delay stages of the delay line circuit.

In operation, the delay of the delay line circuit 114 is adjusted based on the PD signal provided by the phase detector 140 until the CLKBUF and CLKFB signals are in phase. When the CLKBUF and CLKFB signals are in phase, the resulting CLKDLL signal will be in phase with the CLKIN signal. The circuit 100 is said to be in a "locked" condition when the CLKBUF and CLKFB signals are in phase (resulting in the CLKDLL and CLKIN signals being in phase). The delay of the delay line circuit 114 may be adjusted, for example, responsive to the CLKBUF and CLKFB signals drifting out of phase, which may occur for various reasons.

As the CLKBUF signal propagates through enabled delay stages of the delay line circuit 114 to provide the CLKDEL signal, power may be consumed. In some embodiments, when a CLKDLL signal is not needed, the apparatus may be put into an idle state in an effort to conserve power. The apparatus may exit the idle state, that is, enter a non-idle state, for example, when the CLKDLL is needed. During the idle state, an inactive CLKBUF signal may be provided to the delay line circuit 114, which may conserve power by avoiding unnecessary operation of delay stage circuits caused by an active CLKBUF signal. An inactive clock signal is a clock signal that has a constant clock level, and does not transition between high and low clock levels. In contrast, an active clock signal transitions periodically between the high and low clock levels.

Figure 2:
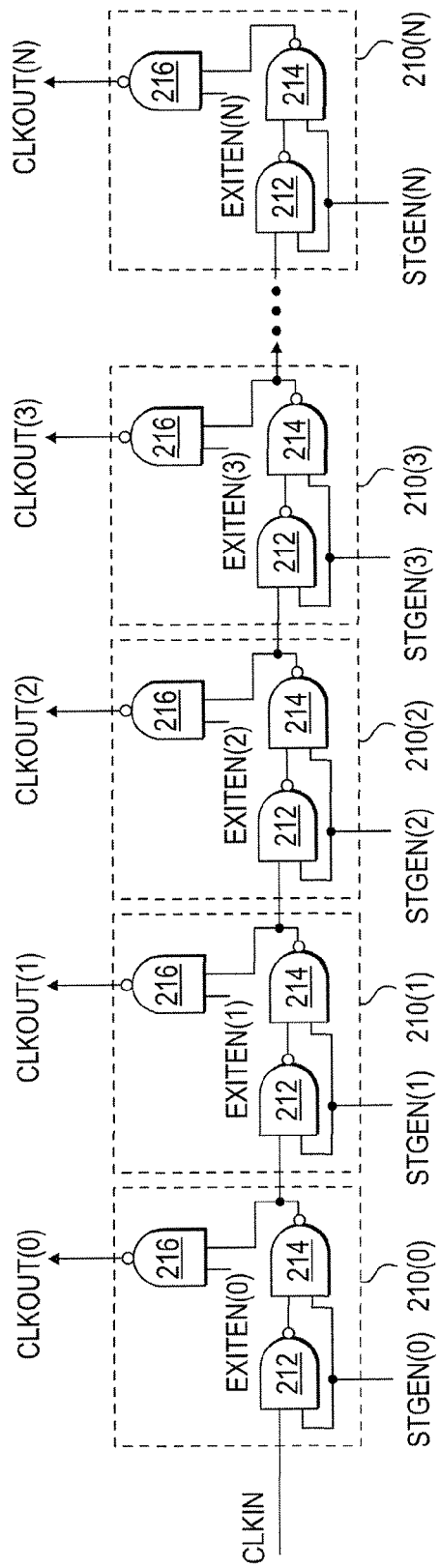
FIG. 2 is a block diagram of a delay line circuit according to an embodiment of the invention.

FIG. 2 illustrates a delay line circuit 200 according to an embodiment of the invention. The delay line circuit 200 may be used as the delay line circuit 114 of FIG. 1. The delay line circuit 200 includes delay stages 210(0)-210(N) coupled in series. An input clock signal CLKIN is delayed by being propagated through enabled ones of the delay stages 210(0)-210(N) to provide an output clock signal CLKOUT having a delay relative to the CLKIN signal. When used as the delay line circuit 114 of FIG. 1, the CLKIN signal is represented by the CLKBUF signal and the CLKOUT signal represents the CLKDEL signal. Each of the delay stages 210(0)-210(N) is configured to delay a respective input clock signal by a stage delay when enabled by an active respective delay stage enable signal STGEN(0)-STGEN(N) (e.g., active high logic level) to provide a respective output signal having the stage delay relative to the respective input clock signal. The STGEN(0)-STGEN(N) signals may be provided by a delay line control circuit, for example, the delay line control circuit 144 of FIG. 1. Each of the delay stages 210(0)-210(N) includes delay circuits 212 and 214, and a delay stage output circuit 216. The delay stage output circuit 216 is provided a respective stage exit enable signal EXITEN. The EXITEN(0)-(N) signals may also be provided by a delay line control circuit such as 144 of FIG. 1. When enabled by the respective EXITEN(0)-EXITEN(N) signal, the delay stage output circuit 216 outputs a respective output clock signal CLKOUT(0)-CLKOUT(N), which may be provided as the CLKOUT signal. The delay circuits 212 and 214 are illustrated in FIG. 2 as NAND logic gates. In other embodiments of the invention, however, a delay stage may include fewer or greater delay circuits, and/or delay circuits other than a NAND logic gate.

In operation, the delay line circuit 200 is provided STGEN(0)-STGEN(N) signals to enable particular ones of the delay stages 210(0)-210(N) to delay the CLKIN signal by a corresponding delay to provide the CLKOUT signal. The CLKIN signal propagates through the enabled delay stages 210(0)-210(N), each enabled delay stage 210 adding a stage delay, and a delay stage 210 having an enabled delay stage output circuit 216 provides the CLKOUT signal.

Figure 3:
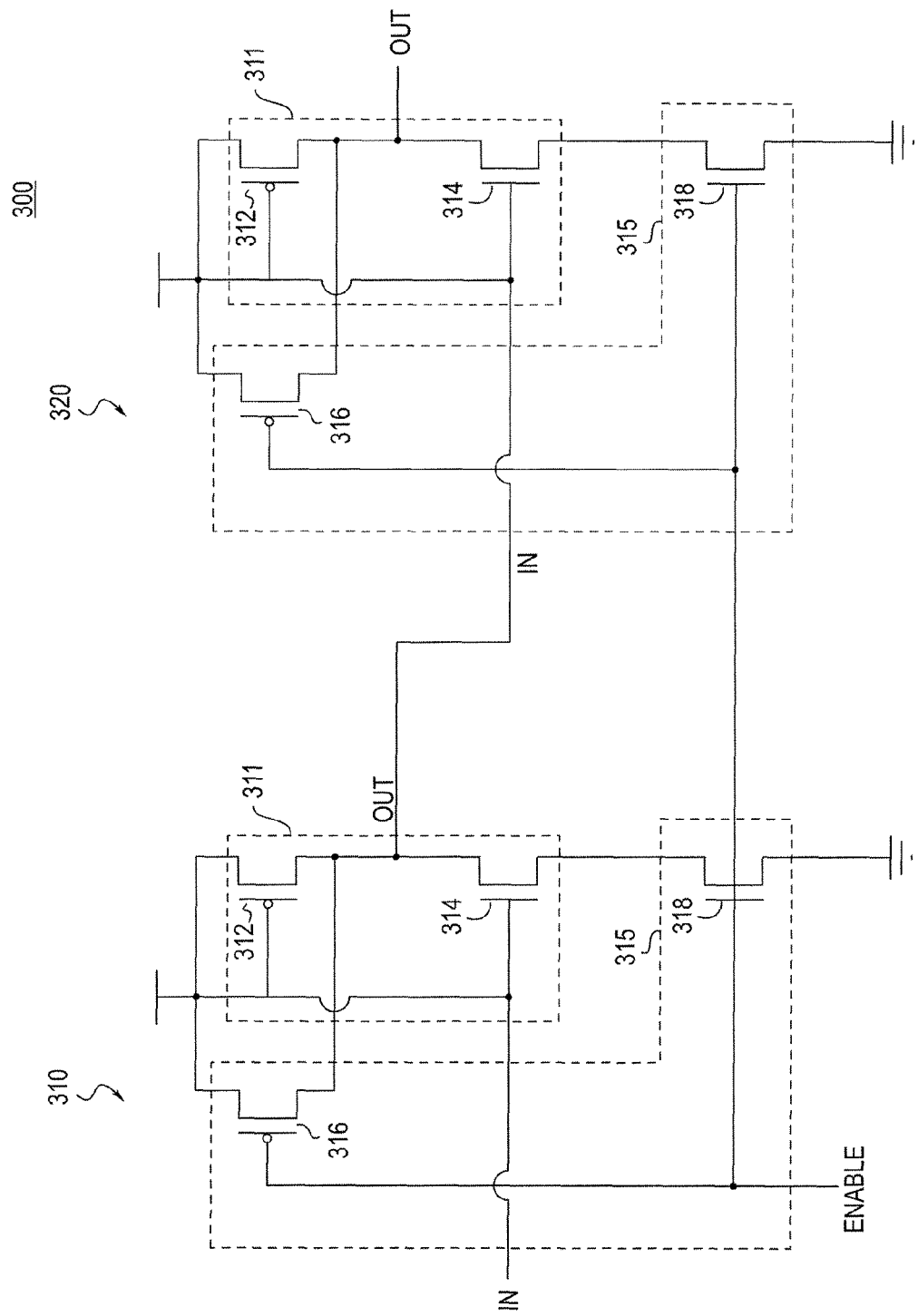
FIG. 3 is a schematic diagram of delay circuits according to an embodiment of the invention.

FIG. 3 illustrates delay circuits 310 and 320 that may be used as the delay circuits 212 and 214 of FIG. 2. The delay circuit 310 includes an inverter 311 that includes a p-type pull-up transistor 312 and an n-type pull-down transistor 314. The inverter 311 is configured to receive an input clock signal IN and provide an output clock signal OUT that has a clock level that is the complement of the clock level of the IN signal. For example, an IN signal having a high clock level results in an OUT signal having a low clock level, and an IN signal having a low clock level results in an OUT signal having a high clock level. An enable circuit 315 is coupled to the inverter 311 to enable the inverter by an active enable signal ENABLE. The enable circuit 315 includes a p-type transistor 316 coupled to the output node and configured to be coupled to a voltage supply (e.g., a voltage supply that provides a supply voltage VCC) and includes an n-type transistor 318 coupled to the n-type pull-down transistor 314 and configured to be coupled to a voltage reference (e.g., ground). The delay circuit 320 includes the same circuits as previously described for the delay circuit 310, and have been shown in FIG. 3 using the same reference numbers. The delay circuits 310 and 320 are enabled by an active ENABLE signal (e.g., active high ENABLE signal) that is provided to the enable circuit 315 of the delay circuits 310 and 320.

In operation, the delay circuits 310 and 320 are disabled by a low logic level ENABLE signal, which causes the n-type transistor 318 to be non-conductive and the p-type transistor 316 to be conductive. As a result, the OUT signal provided by the inverter 311 is held at a high clock level. A voltage of the high clock level OUT signal may be the supply voltage. An active ENABLE signal causes the p-type transistor 316 to be non-conductive and the n-type transistor 318 to be conductive. With the n-type pull-down transistor 314 coupled to the voltage reference and the p-type transistor 316 non-conductive, the output node of the inverter 311 may be coupled to the voltage supply to provide an OUT signal having a high clock level or coupled to the voltage reference to provide an OUT signal having a low clock level to provide an OUT signal having a clock level complementary to the IN signal.

As previously described, an apparatus including a delay line circuit, such as delay line circuit 300, may enter an idle state to conserve power. During the idle state, an inactive clock signal is provided to the delay line circuit. Although an inactive clock signal may be provided to the delay line circuit during an idle state, the enabled delay stages may remain enabled and disabled delay stages may remain disabled. While a delay stage is enabled during an idle state, and an inactive clock signal having a low clock level is provided as the IN signal, the p-type pull-up transistor 312 of the delay circuit 310 may be subject to NBTI degradation, while the p-type pull-up transistor 312 of the delay circuit 320 may not be subject to NBTI degradation. Likewise, an inactive clock signal having a high clock level provided to an enabled delay stage results in an operating condition that may subject the p-type pull-up transistor 312 of the delay circuit 320 to NBTI degradation, while the p-type pull-up transistor 312 of the delay circuit 310 may not be subject to NBTI degradation. As previously discussed, uneven NBTI degradation of the circuits of delay stages of a delay line circuit may cause the delay line circuit to introduce duty cycle error when delaying a clock signal.

Figure 4:
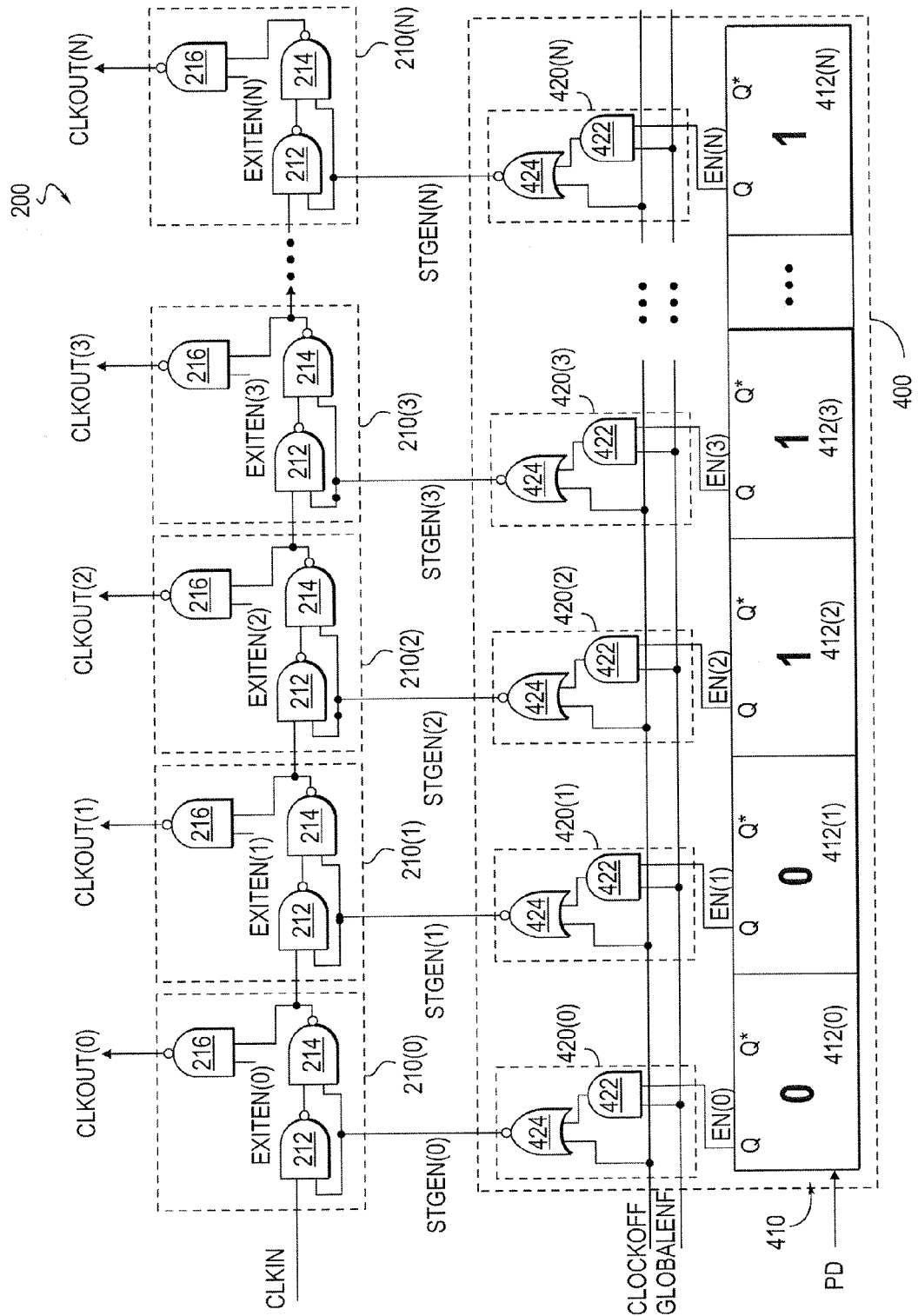
FIG. 4 is a block diagram of a delay line control circuit according to an embodiment of the invention.

FIG. 4 illustrates a delay line control circuit 400 according to an embodiment of the invention. In the embodiment of FIG. 4, the delay line control circuit 400 is coupled to the delay line circuit 200 of FIG. 2. The delay line control circuit 400 includes a shift register 410 and delay stage enable logic 420(0)-(N). The shift register 410 is configured to provide delay stage control signals EN(0)-(N) to delay stage enable logic 420(0)-(N) to enable particular ones of the delay stages 210(0)-(N) to provide a desired delay. The shift register includes registers 412(0)-(N) configured to store information for a respective delay stage. The information may be based on a phase difference signal PD, that may be provided, for example, from a phase detector such as phase detector 140 of FIG. 1. The information is used to provide a corresponding delay stage control signal EN(0)-(N) to the respective delay stage enable logic 420(0)-(N).

The delay stage enable logic 420(0)-(N) are further provided a global enable signal GLOBALENF and a delay stage hold signal CLOCKOFF. The delay stage enable logic 420(0)-420(N) may include AND-OR-INVERT (AOI) logic. For example, each of the delay stage enable logic 420(0)-420(N) includes an AND logic gate 422 that is provided a respective EN signal from the shift register 410 and the GLOBALENF signal, and further includes a NOR logic gate 424 that is coupled to the output of the AND logic gate 422 and is provided the CLOCKOFF signal. The CLOCKOFF signal may have a logic level based on the idle state, for example, having a high logic level during an idle state and having a low logic level otherwise. The CLOCKOFF signal may be provided by control logic (not shown in FIG. 4), and in some embodiments, may be an existing control signal already used to control other circuitry during an idle state.

In operation, the delay stages 210(0)-(N) may all be enabled responsive to an active GLOBALENF signal (e.g., active low logic level). All of the delay stages 210(0)-210(N) may be enabled during, for example, initialization of a clock circuit that includes the delay line circuit 200.

A delay stage 210(0)-(N) may be enabled to delay a respective input clock signal by a stage delay by setting the information stored by the respective register 412(0)-(N) to provide a low logic level EN signal. For example, assuming inactive GLOBALENF and CLOCKOFF signals (e.g., a high logic level GLOBALENF signal and a low logic level CLOCKOFF signal), setting the information of a register 412(0)-(N) to a "0" results in a respective STGEN(0)-(N) signal having a high logic level that enables the respective delay stage 210(0)-(N). In contrast, setting the information for a register 412(0)-(N) to a "1" results in a respective STGEN(0)-(N) signal having a low logic level that disables the respective delay stage 210(0)-(N). As an example, FIG. 4 illustrates "0" information stored in the register 412(0) and 412(1) to enable delay stages 210(0) and 210(1), while the remaining registers store "1" information to disable the delay stages 210(3)-210(N).

As previously discussed, during an idle state, the delay stages 210(0)-(N) may remain enabled or disabled based on the information stored by the respective register 412(0)-(N) at the time the idle state begins. An inactive clock signal provided to the delay line circuit 200 during an idle state may result in voltage conditions for the circuits of the delay stages 210(0)-(N) that can cause uneven degradation of electrical characteristics, which may cause the delay line circuit 200 to distort an input clock signal as it propagates through the delay stages 210(0)-(N). For example, with reference to the delay circuits 310 and 320 of FIG. 3, as previously described, an inactive clock signal may result in NBTI degradation of the p-type pull-up transistor 312 of one of the two delay circuits. An inactive clock signal having a high clock level provided to the enabled delay circuit 310 will cause a low clock level to be provided to the enabled delay circuit 320, which may result in NBTI degradation of the p-type pull-up transistor 312 of the delay circuit 320 but not the p-type pull-up transistor 312 of the delay circuit 310. An inactive clock signal having a low clock level provided to the enabled delay circuit may result in NBTI degradation of the p-type pull-up transistor 312 of the delay circuit 310, but not the p-type pull-up transistor 312 of the delay circuit 320.

With the delay line control circuit 400, the delay stages 210(0)-(N) may be controlled so that the delay circuits of the enabled delay stages provide a high clock level output during an idle state. That is, responsive to an active CLOCKOFF signal (e.g., active high logic level) the delay stage enable logic 420(0)-(N) provide low logic level STGEN(0)-(N) signals to control the delay circuits of the respective delay stages 210(0)-(N) to provide a high clock level, regardless of whether the respective delay stage 210 is enabled. In particular, the active CLOCKOFF signal causes the NOR logic gate to provide a low logic level STGEN(0)-(N) signal regardless of a "0" being stored by a respective register 412(0)-(N). The low logic level STGEN(0)-(N) signal causes the p-type transistors 316 of the enabled delay stages to be conductive thereby coupling a respective output to the supply voltage to provide a respective clock signal having a high clock level. The high clock level is provided to the p-type pull-up transistor 312, which is an operating condition that does not result in NBTI degradation of the transistor 312. An inactive CLOCKOFF signal (e.g., inactive low logic level) may be provided to the delay stage enable logic 420(0)-(N) when an idle state is exited or during a non-idle state, which allows the STGEN(0)-(N) signals to have a logic level based on the information stored by the respective register 412(0)-(N) for normal operation.

As previously described, the delay line control circuit 400 may be used to control delay circuits of the delay stages to mitigate degradation of an electrical characteristic, such as NBTI degradation of p-type transistors, when an inactive clock signal is provided, for example, during an idle state. As previously described, the delay circuits of the delay stages may be controlled by the CLOCKOFF signal to provide a voltage to downstream p-type transistors of enabled delay stages that may prevent NBTI degradation, for example, a clock signal having a high clock level.

Figure 5:
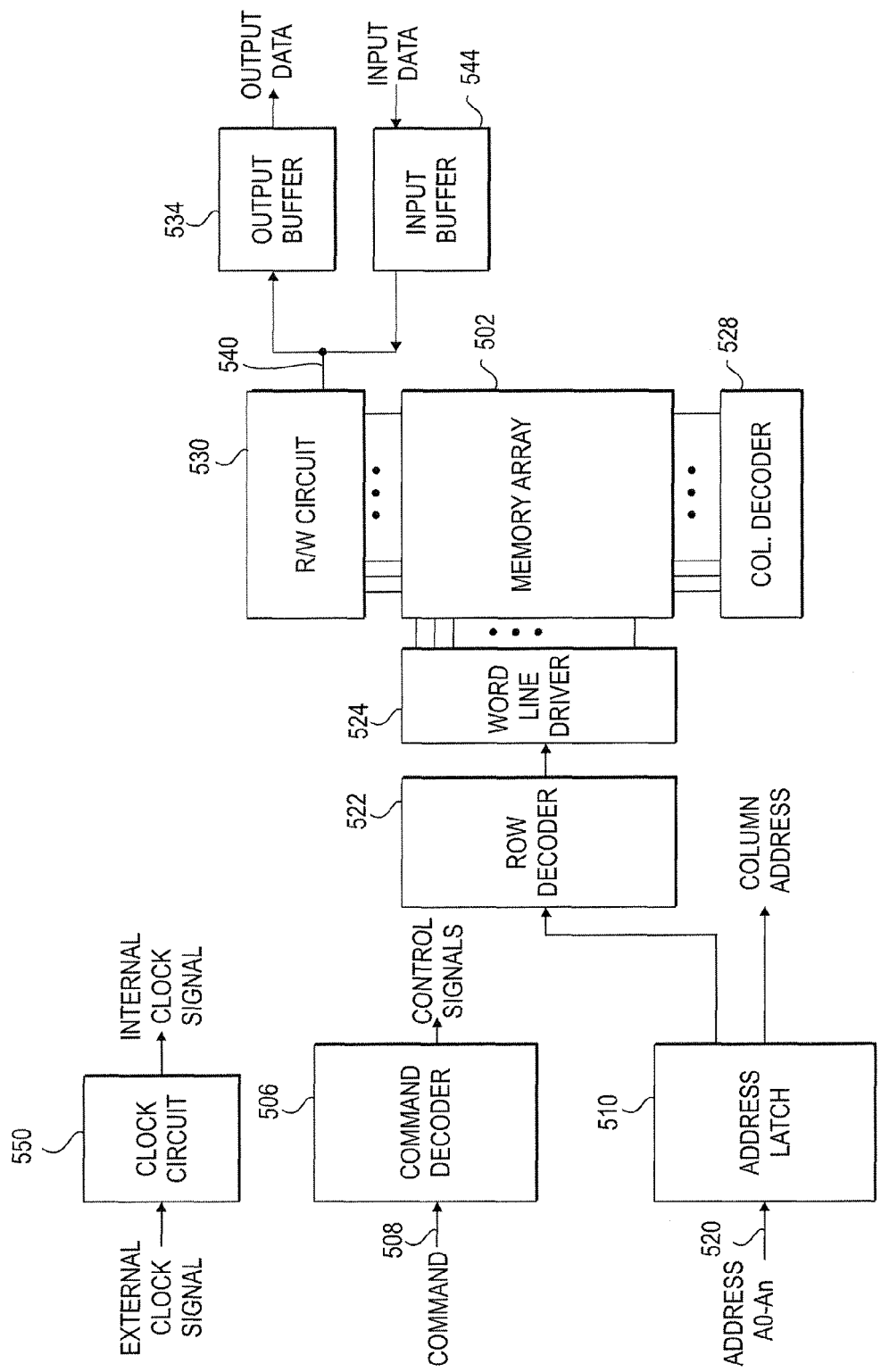
FIG. 5 is a block diagram of a memory including a delay line control circuit according to an embodiment of the invention.

FIG. 5 illustrates a portion of a memory 500 according to an embodiment of the present invention. The memory 500 includes an array 502 of memory cells, which may be, for example, volatile memory cells (e.g., DRAM memory cells, SRAM memory cells, etc.), non-volatile memory cells (e.g., flash memory cells, PCM cells, etc.), or some other types of memory cells. The memory 500 includes a command decoder 506 that receives memory commands through a command bus 508 and generates control signals within the memory 500 to carry out various memory operations on the memory array 502. For example, the command decoder 506 may be used to generate internal control signals to read data from and write data to the memory array 502. Row and column address signals are applied to the memory 500 through an address bus 520 and provided to an address latch 510. The address latch then outputs a separate column address and a separate row address.

The row and column addresses are provided by the address latch 510 to a row address decoder 522 and a column address decoder 528, respectively. The column address decoder 528 selects bit lines extending through the array 502 corresponding to respective column addresses. The row address decoder 522 is connected to word line driver 524 that activates respective rows of memory cells in the array 502 corresponding to received row addresses. The selected data line corresponding to a received column address are coupled to a read/write circuitry 530 to provide read data to a data output buffer 534 via an input-output data bus 540. Write data are applied to the memory array 502 through a data input buffer 544 and the memory array read/write circuitry 530.

A clock circuit 550 according to an embodiment of the invention is configured to receive an external clock signal and generate a synchronized internal clock signal. The clock circuit 550 may supply one or more clock signals to one or more of the command decoder 506, address latch 510, read/write circuitry 530, data output buffer 534, and input buffer 544 to facilitate the latching of command, address, and data signals in accordance with the external clock.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a delay line circuit including a plurality of delay stages; and
a delay line control circuit coupled to the delay line circuit, the delay line control circuit configured to enable delay stages of the plurality of delay stages and further configured to control enabled delay stages of the plurality of delay stages to force a respective output clock signal to a high logic level during an idle state, wherein the delay line control circuit comprises:
a shift register including a plurality of registers, each register of the plurality of registers associated with a respective delay stage of the plurality of delay stages and configured to store information related to enabling or disabling the respective delay stage of the plurality of delay stages; and
a plurality of delay stage logic, each delay stage logic of the plurality of delay stage logic coupled to a respective delay stage of the plurality of delay stages and further coupled to a respective register of the plurality of registers, each delay stage logic of the plurality of delay stage logic configured to provide a delay stage enable signal to the respective delay stage of the plurality of delay stages.

2. The apparatus of claim 1 wherein each delay stage logic of the plurality of delay stage logic is configured to provide a delay stage enable signal to the respective delay stage of the plurality of delay stages having a logic level based on information stored in the respective register of the plurality of registers during a non-idle state, and further configured to provide a delay stage enable signal having a logic level to disable the respective delay stage of the plurality of delay stages during an idle state.

3. The apparatus of claim 1 wherein the delay stage logic comprises AND-OR INVERT logic.

4. An apparatus, comprising:
a delay line circuit including a plurality of delay stages; and
a delay line control circuit coupled to the delay line circuit, the delay line control circuit configured to enable delay stages of the plurality of delay stages and further configured to control enabled delay stages of the plurality of delay stages to necessarily provide a respective output clock signal having a high logic level during an idle state,
wherein a delay stage of the plurality of delay stages comprises:
an inverter configured to invert an input signal and provide an inverted output signal; and
an enable circuit coupled to the inverter and configured to couple the inverter to a voltage reference responsive to an active delay stage enable signal provided by the delay line control circuit.

5. The apparatus of claim 4 wherein the enable circuit comprises:
a p-type transistor configured to be coupled to a voltage supply and an output of the inverter; and
an n-type transistor configured to be coupled to a voltage reference and the inverter, wherein the delay stage enable signal is provided to the p-type and n-type transistors.

6. The apparatus of claim 1 wherein a delay stage of the plurality of delay stages is configured to provide an output clock signal having a high logic level regardless of a clock level of an input clock signal when the delay line control circuit controls the enabled delay stages of the plurality of delay stages to provide a respective output clock signal having a high logic level during an idle state.

7. An apparatus, comprising:
a delay stage including first and second delay circuits, the first and second delay circuits configured to be enabled responsive to an active delay stage enable signal and disabled responsive to an inactive delay stage enable signal;
a register configured to store information related to the enablement of the delay stage and provide a delay stage control signal having a logic level based on the information; and
delay stage logic coupled to the delay stage and the register, and configured to receive a delay stage hold signal, the delay stage logic configured to provide the delay stage enable signal to the first and second delay circuits based on a logic level of the delay stage control signal responsive to an inactive delay stage hold signal, and the delay stage logic further configured to provide an inactive delay stage enable signal to the first and second delay circuits responsive to an active delay stage hold signal and not based on the logic level of the delay stage control signal.

8. The apparatus of claim 7 wherein the first and second delay circuits are configured to provide a respective output clock signal having a high clock level when disabled.

9. The apparatus of claim 7 wherein the delay stage logic is configured to provide an active delay stage enable signal to enable the first and second delay circuits responsive to an active global enable signal regardless of the logic level of the delay stage control signal.

10. The apparatus of claim 7 wherein the delay stage logic comprises:
an AND logic gate coupled to the register to receive the delay stage control signal; and
a NOR logic gate coupled to the AND logic gate and configured to receive the delay stage hold signal.

11. The apparatus of claim 7 wherein the first and second delay circuits comprise first and second NAND logic gates.

12. The apparatus of claim 7 wherein the first delay circuit comprises a first p-type pull-up transistor having a gate coupled to an input of the delay stage and wherein the second delay circuit comprises a second p-type pull-up transistor having a gate coupled to an output of the first delay circuit.

13. The apparatus of claim 7 wherein the delay stage further comprises a delay stage output circuit coupled to the second delay circuit, the delay stage output circuit configured to provide an output clock signal of the second delay circuit when enabled.

14. A method, comprising:
enabling a delay stage;
entering an idle state;
providing an inactive clock signal to the delay stage during the idle state; and
controlling delay circuits of the enabled delay stage to force an output clock signal to a high clock level during the idle state.

15. A method, comprising:
enabling a first delay stage;
entering an idle state; and
controlling delay circuits of the enabled first delay stage to necessarily provide an output clock signal having a high clock level during the idle state;
enabling a second delay stage coupled to the first delay stage; and
controlling delay circuits of the enabled second delay stage to provide an output clock signal having a high clock level during the idle state.

16. A method, comprising:
enabling a delay stage;
entering an idle state; and
controlling delay circuits of the enabled delay stage to necessarily provide an output clock signal having a high clock level during the idle state, wherein controlling delay circuits of the enabled delay stage to provide an output clock signal having a high clock level during the idle state comprises causing a p-type transistor of the delay circuits to be conductive to couple outputs of the delay circuits to a supply voltage.

17. The method of claim 14, further comprising controlling delay circuits of the enabled delay stage to provide an output clock signal based on a clock level of a respective input clock signal when not in the idle state.

18. A method, comprising:
enabling a delay stage based on information programmed in a register;
disabling the enabled delay stage responsive to an idle state and not based on the information programmed in the register; and
enabling the delay stage based on the information programmed in the register after the idle state.

19. The method of claim 18 wherein disabling the enabled delay stage comprises providing an inactive delay stage enable signal to the delay stage responsive to an active control signal indicative of the idle state.

20. The method of claim 18 wherein disabling the enabled delay stage comprises controlling delay circuits of the enabled delay stage to provide an output clock signal having a high clock level.

21. The method of claim 18, further comprising maintaining a value of the information during the idle state.

* * * * *